United States Patent
Lanzillo et al.

(10) Patent No.: US 10,830,841 B1
(45) Date of Patent: Nov. 10, 2020

(54) MAGNETIC TUNNEL JUNCTION PERFORMANCE MONITORING BASED ON MAGNETIC FIELD COUPLING

(71) Applicant: International Business Machines Corporation, Armonk, NY (US)

(72) Inventors: Nicholas Anthony Lanzillo, Troy, NY (US); Benjamin D. Briggs, Waterford, NY (US); Michael Rizzolo, Delmar, NY (US); Lawrence A. Clevenger, Saratoga Springs, NY (US); Theodorus E. Standaert, Clifton Park, NY (US); James Stathis, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/445,690

(22) Filed: Jun. 19, 2019

(51) Int. Cl.
*G11C 11/16* (2006.01)
*G01R 33/09* (2006.01)
*H01L 27/22* (2006.01)

(52) U.S. Cl.
CPC .......... *G01R 33/098* (2013.01); *G11C 11/161* (2013.01); *G11C 11/1673* (2013.01); *H01L 27/22* (2013.01)

(58) Field of Classification Search
CPC .......................... G11C 11/1673; G01R 33/098
See application file for complete search history.

(56) References Cited

U.S. PATENT DOCUMENTS

| | | |
|---|---|---|
| 7,239,543 B2 | 7/2007 | Chung et al. |
| 7,541,804 B2 | 6/2009 | Chung et al. |
| 8,363,457 B2 | 1/2013 | Keshtbod |
| 9,368,179 B2 | 6/2016 | Katti et al. |
| 9,541,605 B1 | 1/2017 | Kothandaraman |
| 9,618,589 B2 | 4/2017 | Zimmer et al. |
| 9,874,609 B2 | 1/2018 | Rasbornig et al. |

(Continued)

FOREIGN PATENT DOCUMENTS

JP 2009514229 A 4/2009

OTHER PUBLICATIONS

I. Yoon et al., "Modeling and Analysis of Magnetic Field Induced Coupling on Embedded STT-MRAM Arrays," IEEE Transactions on Computer-Aided Design of Integrated Circuits and Systems, Feb. 2018, pp. 337-349, vol. 37, No. 2.

*Primary Examiner* — Jay W. Radke
(74) *Attorney, Agent, or Firm* — James Nock; Ryan, Mason & Lewis, LLP (57) ABSTRACT

A semiconductor device includes a device magnetic tunnel junction (MTJ) and sensor MTJs. A spin polarization of a free layer of the device MTJ is configurable based at least in part on electrical energy supplied to the device MTJ. A spin polarization of a corresponding free layer of each sensor MTJ is configurable based at least in part on a magnetic field created by the spin polarization of the free layer of the device MTJ. A circuit disposed is in electrical communication with the plurality of sensor MTJs and configured to determine the corresponding free layer spin polarizations of each of the sensor MTJs based at least in part on electrical energy supplied to the sensor MTJs by the circuit. The circuit is configured to determine a magnetoresistance of the device MTJ based at least in part on the determined corresponding free layer spin polarizations of the sensor MTJ.

20 Claims, 9 Drawing Sheets

(56) References Cited

U.S. PATENT DOCUMENTS

| | | |
|---|---|---|
| 2007/0063690 A1 | 3/2007 | De Wilde et al. |
| 2015/0138879 A1* | 5/2015 | Sun .................... G11C 11/1677 365/158 |
| 2018/0018104 A1* | 1/2018 | Farahani ............ G11C 13/0069 |
| 2018/0040666 A1 | 2/2018 | Shibata et al. |
| 2019/0140020 A1* | 5/2019 | Ying .................. H01F 10/3236 |

\* cited by examiner

MAGNETIC TUNNEL JUNCTION PERFORMANCE MONITORING BASED ON MAGNETIC FIELD COUPLING

TECHNICAL FIELD

This present application generally relates to semiconductor devices, and, in particular, to the use of magnetic tunnel junctions (MTJs) in semiconductor devices.

BACKGROUND

Unlike conventional random access memory (RAM) chip technologies, magnetic RAM (MRAM) does not store data as an electric charge, but instead stores data by magnetic polarization of storage elements. Typically, a magnetic storage element is formed from two ferromagnetic layers separated by a tunneling layer. One of the ferromagnetic layers has at least one pinned magnetic polarization (also called a fixed layer) set to a particular polarity. The magnetic polarity of the other ferromagnetic layer (also called a free layer) is altered to represent either a "1" (i.e., anti-parallel polarity to the fixed layer) or "0" (i.e., parallel polarity to the fixed layer). One device having a fixed layer, a tunneling layer, and a free layer is an MTJ. The electrical resistance of an MTJ is dependent on the magnetic polarity of the free layer compared to the magnetic polarity of the fixed layer. A memory device such as MRAM can be built from an array of individually addressable MTJs.

SUMMARY

Illustrative embodiments comprise semiconductor devices that are configured to monitor the magnetization strength of the free layer of a device MTJ using magnetic coupling to a plurality of sensor MTJs.

For example, in one embodiment, a semiconductor device is disclosed. The semiconductor device comprises a device magnetic tunnel junction comprising a free layer, a fixed layer and at least one insulating layer disposed between the free layer and the fixed layer. A spin polarization of the free layer is configurable based at least in part on electrical energy supplied to the device magnetic tunnel junction by the semiconductor device. The semiconductor device further comprises a plurality of sensor magnetic tunnel junctions spaced apart from the device magnetic tunnel junction. Each sensor magnetic tunnel junction comprises a corresponding free layer, a corresponding fixed layer and at least one corresponding insulating layer disposed between the corresponding free layer and the corresponding fixed layer. A spin polarization of the corresponding free layer of each sensor magnetic tunnel junction is configurable based at least in part on a magnetic field created by the spin polarization of the free layer of the device magnetic tunnel junction. The semiconductor device further comprises a circuit disposed in electrical communication with the plurality of sensor magnetic tunnel junctions and configured to determine the corresponding free layer spin polarizations of each of the sensor magnetic tunnel junctions based at least in part on electrical energy supplied to the sensor magnetic tunnel junctions by the circuit. The circuit is configured to determine a magnetoresistance of the device magnetic tunnel junction based at least in part on the determined corresponding free layer spin polarizations of the sensor magnetic tunnel junctions.

Other embodiments will be described in the following detailed description of embodiments, which is to be read in conjunction with the accompanying figures.

DETAILED DESCRIPTION

Embodiments will now be described in further detail with regard to semiconductor devices comprising MTJs and methods to monitor performance of the MTJs based on magnetic field coupling between MTJs. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
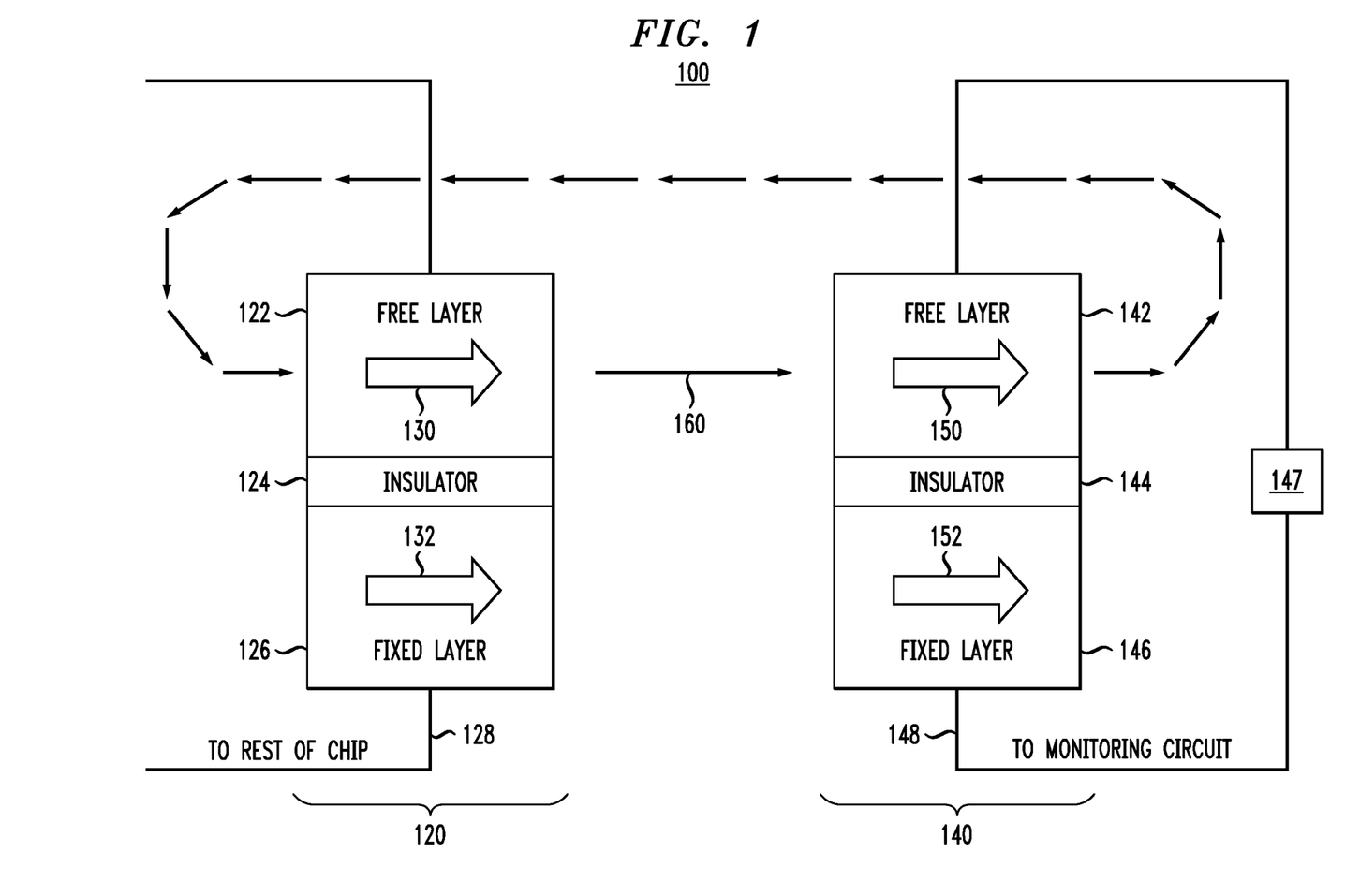
FIG. 1 is a diagram of device and sensor MTJs of a semiconductor device according to an embodiment of the present disclosure.
Figure 2:
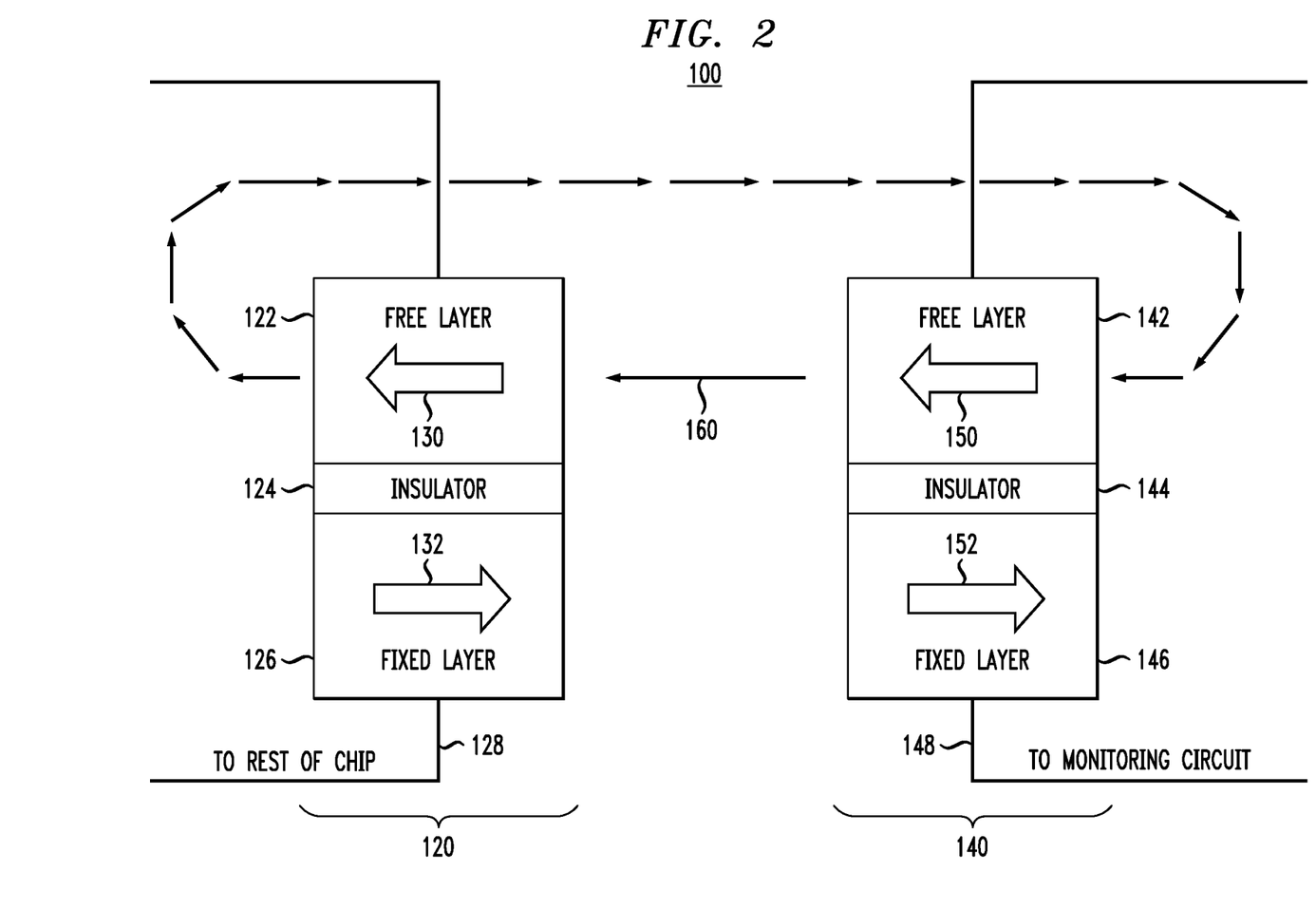
FIG. 2 is a diagram of the device and sensor MTJs of the semiconductor device of FIG. 1 after a change in the spin polarization of the free layer of the device MTJ according to an embodiment of the present disclosure.

FIGS. 1 and 2 schematically illustrate a semiconductor device 100 comprising a device MTJ 120 and a sensor MTJ 140, according to an embodiment of the invention. Each of MTJs 120 and 140 comprises two layers of ferromagnetic material separated by a thin insulating tunnel barrier layer. The insulating layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic layers. The two ferromagnetic layers are designed to have different responses to magnetic fields so that the relative orientation of their moments can be varied with an external magnetic field.

MRAM is a type of solid state memory that uses tunneling magnetoresistance (TMR) to store information. MRAM is made up of an electrically connected array of magnetoresistive memory elements such as MTJs. Each MTJ includes a free layer having a magnetization direction that is variable, and a fixed layer having a magnetization direction that is invariable. The free layer and fixed layer each include a layer of a magnetic material, and are separated by an insulating non-magnetic tunnel barrier. An MTJ stores information by switching the magnetization state of the free layer. When the magnetization direction of the free layer is parallel to the magnetization direction of the fixed layer, the MTJ is in a low resistance state. When the magnetization direction of the free layer is anti-parallel to the magnetization direction of the fixed layer, the MTJ is in a high resistance state. The difference in resistance of the MTJ can be used to indicate a logical '1' or '0', thereby storing a bit of information. The TMR of an MTJ determines the difference in resistance between the high and low resistance states. A relatively high difference between the high and low resistance states facilitates read operations in the MRAM. In some cases, however, the difference between the high and low resistance states may be degraded or reduced, for example, due to manufacturing processes, thermal conditions, or in another manner. For example, in some cases the electrons of the free layer may not be fully aligned during formation or in operation which results in a smaller difference in resistance between the high and low resistance states. This smaller difference may inhibit the use of the MTJ as a memory device.

As shown in FIGS. 1 and 2, device MTJ 120 comprises a free layer 122, an insulator 124 and a fixed layer 126, and sensor MTJ 140 comprises a free layer 142, an insulator 144, and a fixed layer 146. In illustrative embodiments, sensor MTJ 140 has a size or width that is equal to or less than a size or width of the device MTJ 120.

Free layers 122 and 142 and fixed layers 126 and 146 comprise any suitable material, combination of materials, or alloy that exhibits magnetic properties, such as a ferromagnetic material or a ferromagnetic thin film including, e.g., Fe, FeCo, CoFeB, FeNi, or other ferromagnetic materials. In some embodiments, for example, free layers 122 and 142 and fixed layers 126 and 146 may comprise ferromagnetic alloys, e.g., FeAl, FeN, etc., comprising a magnetic element such as, e.g., Fe, Co, etc., and a non-magnetic element such as, e.g., Al, N, etc. In some embodiments, free layers 122 and 142 comprise the same ferromagnetic material as fixed layers 126 and 146. In other embodiments, free layers 122 and 142 comprise a different ferromagnetic material than fixed layers 126 and 146. For example, free layers 122 and 142 may comprise Fe while fixed layers 126 and 146 may comprise FeCo or vice versa.

Insulators 124 and 144 provide a tunnel barrier between the free layers 122 and 142 and the fixed layers 126 and 146. Example materials for insulators 124 and 144 include a crystalline magnesium oxide (MgO), an amorphous aluminum oxide ($Al_2O_3$), or other similar materials. In some embodiments, insulators 124 and 144 may comprise a doped MgO barrier, for example, MgXO where X may comprise Fe, Mn, Zn, Zr, Ti, or other materials that may be used for doping the MgO barrier.

In illustrative embodiments, the device MTJ 120 is electrically connected to various analog and digital circuitry or mixed-signal circuitry of the semiconductor device 100 by a lead 128, e.g., copper or another conductive material. In some embodiments, for example, device MTJ 120 serves as memory on the semiconductor device 100 to store digital information, for example, as described above.

In illustrative embodiments, the sensor MTJ 140 is electrically connected to a monitoring circuit 147 of the semiconductor device 100 by a lead 148, e.g., copper or another conductive material. In illustrative embodiments, the sensor MTJ 140 and the monitoring circuit 147 are electrically isolated from the device MTJ 120 and the various analog and digital circuitry or mixed-signal circuitry of the semiconductor device 100.

In illustrative embodiments, device MTJ 120 has a size or width between about 50 nm and 200 nm. In illustrative embodiments, sensor MTJ 140 has a size equal to or less than MTJ 120.

As seen in FIGS. 1 and 2, the free layer 122 of the device MTJ 120 has a spin polarization 130 and the fixed layer 126 of the device MTJ 120 has a spin polarization 132. As noted above, the spin polarization 132 of the fixed layer 126 is fixed in a particular direction while the spin polarization 130 of the free layer 122 is adjustable between parallel and anti-parallel states with respect to the spin polarization 132 of the fixed layer 126. For example, as seen in FIG. 1, the spin polarization 130 of the free layer 122 is parallel to the spin polarization 132 of the fixed layer 126, thereby providing a low resistance state of the device MTJ 120. As seen in FIG. 2, the spin polarization 130 of the free layer 122 is anti-parallel to the spin polarization 132 of the fixed layer 126, thereby providing a high resistance state of the device MTJ 120.

In illustrative embodiments, the spin polarization 130 of the free layer 122 of the device MTJ 120 may be changed between the parallel and anti-parallel states through the supply of electrical energy to the MTJ 120 via lead 128. As an example, electrical energy supplied in a first direction along lead 128 may set the spin polarization 130 of the free layer 122 to the parallel state while electrical energy supplied in a second direction along lead 128 may set the spin polarization 130 of the free layer 122 to the anti-parallel state. In some embodiments, for example, an electrical energy having 500 mV may be supplied to the device MTJ 120 along lead 128 to change the state of the spin polarization 130 of the free layer 122 from parallel to anti-parallel or vice versa.

As seen in FIGS. 1 and 2, the spin polarization 130 of the free layer 122 of the device MTJ 120 generates a magnetic field 160. Magnetic field 160 travels in the direction of the spin polarization 130 such that when the spin polarization 130 changes from the parallel state (FIG. 1) to the anti-parallel state (FIG. 2), the magnetic field 160 also changes direction to align with the spin polarization 130. In illustrative embodiments, the magnetic field 160 extends up to several times the distance of the diameter of the device MTJ 120.

With reference again to FIGS. 1 and 2, the free layer 142 of the sensor MTJ 140 has a spin polarization 150 and the fixed layer 146 of the sensor MTJ 140 has a spin polarization 152. As noted above, the spin polarization 152 of the fixed layer 146 is fixed in a particular direction while the spin polarization 150 of the free layer 142 is adjustable between parallel and anti-parallel states with respect to the spin polarization 152 of the fixed layer 146. For example, as seen in FIG. 1, the spin polarization 150 of the free layer 142 is parallel to the spin polarization 152 of the fixed layer 146, thereby providing a low resistance state of the sensor MTJ 140. As seen in FIG. 2, the spin polarization 150 of the free layer 142 is anti-parallel to the spin polarization 152 of the fixed layer 146, thereby providing a high resistance state of the sensor MTJ 140.

In illustrative embodiments, the spin polarization 150 of the free layer 142 of the sensor MTJ 140 may be changed between the parallel and anti-parallel states due to the magnetic field 160 generated by the spin polarization 130 of the free layer 122 of the device MTJ 120. For example, as seen in FIG. 1, the magnetic field 160 generated by the spin polarization 130 of the free layer 122 of device MTJ 120 when in the parallel state causes the spin polarization 150 of the free layer 142 of sensor MTJ 140 to also change to the parallel state. Likewise, as seen in FIG. 2, when the spin polarization 130 of the free layer 122 of the device MTJ 120 is changed to the anti-parallel state, for example, by supplying electrical energy to the device MTJ 120, the magnetic field 160 also changes directions and causes the spin polarization 150 of the free layer 142 of sensor MTJ 140 to also change to the anti-parallel state.

With reference to FIGS. 3-8, in illustrative embodiments, an array or pattern of sensor MTJs 140 may be utilized to monitor the stability and performance of the device MTJ 120. For example, the sensor MTJs 140 may be utilized to determine the TMR of the device MTJ 120 based at least in part on the strength and orientation of the magnetic field and its effect on the spin polarizations 150 of the free layers 142 of the sensor MTJs 140. The use of magnetic coupling between the device MTJ 120 and the sensor MTJ 140 allows for detection and determination of the TMR of the device MTJ 120 without requiring electrical coupling between the sensor MTJs 140 and the device MTJ 120 which reduces or inhibits any impact that the sensor MTJs 140 will have on the operation of the device MTJs 120 and the semiconductor device 100 as a whole.

Figure 3:
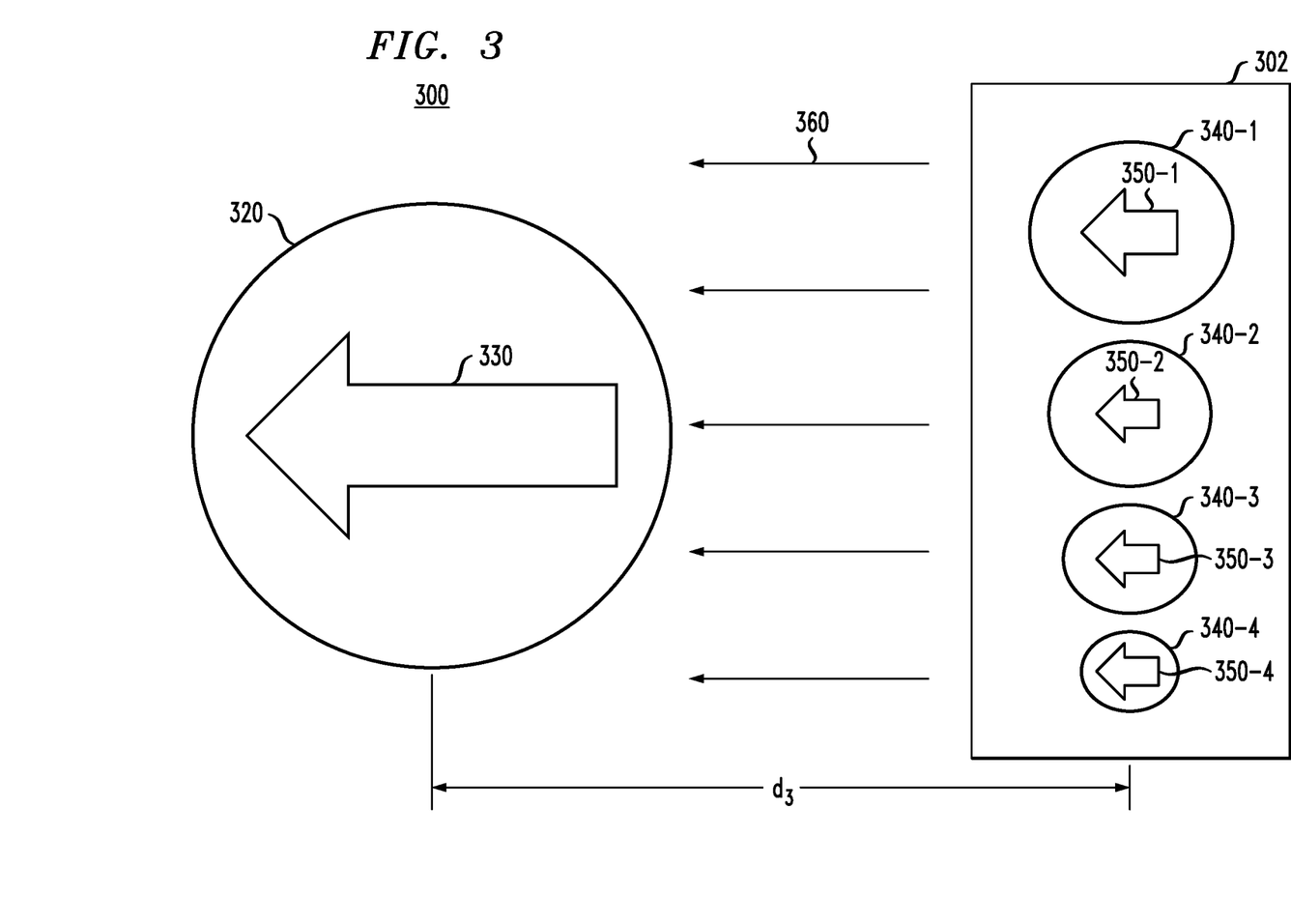
FIG. 3 is a diagram showing of an example arrangement of device and sensor MTJs according to an embodiment of the present disclosure.
Figure 4:
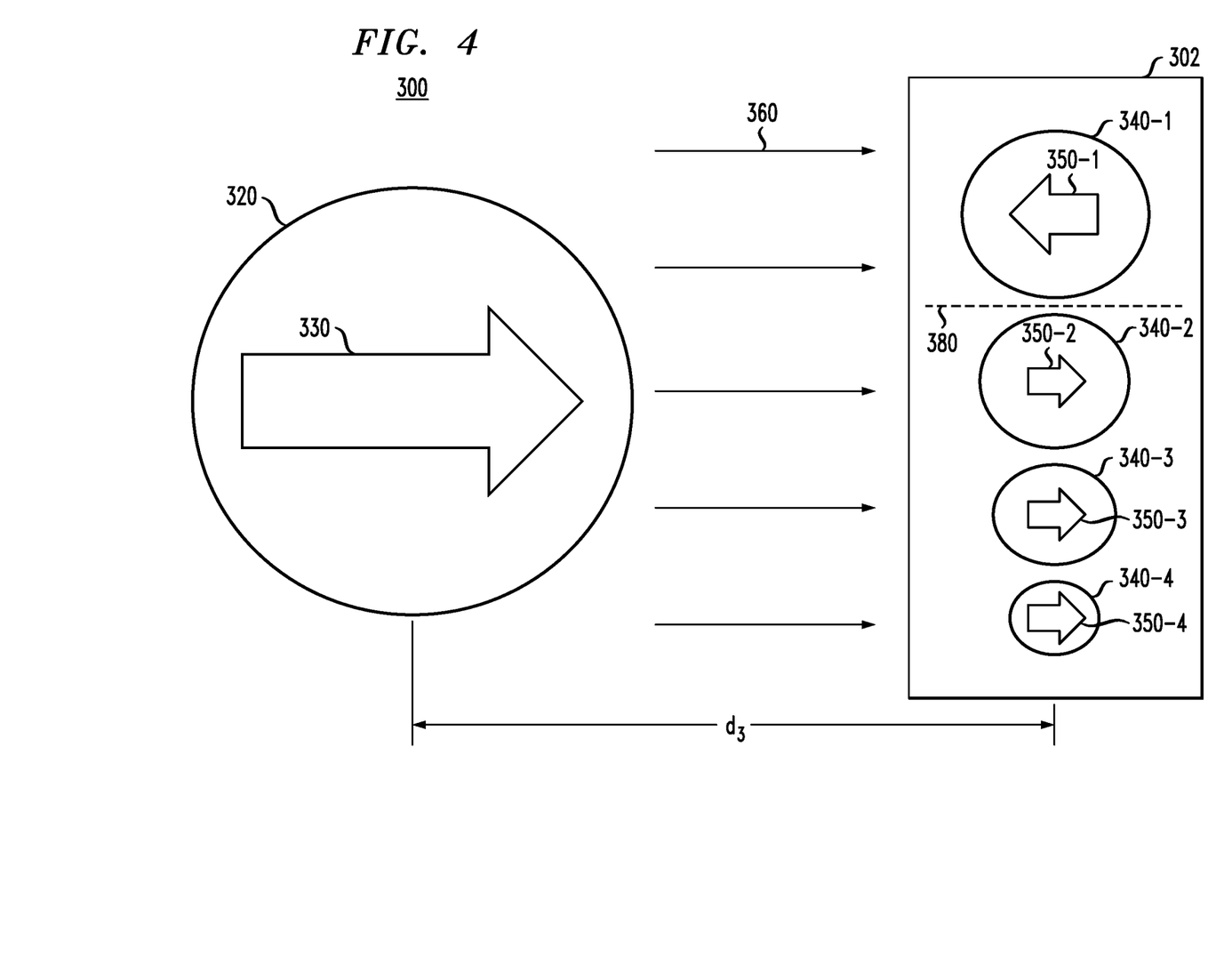
FIG. 4 is a diagram of the example arrangement of FIG. 3 after a change in the spin polarization of the free layer of the device MTJ according to an embodiment of the present disclosure.

With reference now to FIGS. 3 and 4, an example diagram 300 of a device MTJ 320 and an array 302 of sensor MTJs 340 is illustrated from a top down perspective according to an illustrative embodiment. Device MTJ 320 is similar to and includes the same features as described above for device MTJ 120. Sensor MTJs 340 are each similar to and include the same features as described above for sensor MTJ 140.

As seen in FIGS. 3 and 4, the array 302 comprises sensor MTJs 340-1, 340-2, 340-3 and 340-4 each having a different size or width. For example, as shown in FIGS. 3 and 4, sensor MTJ 340-1 has a size or width that is larger than sensor MTJ 340-2, sensor MTJ 340-2 has a size or width that is larger than sensor MTJ 340-3 and sensor MTJ 340-3 has a size or width that is larger than sensor MTJ 340-4. In illustrative embodiments, each sensor MTJ 340 in the array 302 also has a smaller size or width than the device MTJ 320. In some embodiments, the largest sensor MTJ 340 may have the same size or width as the device MTJ 320.

In illustrative embodiments, each of sensor MTJs 340-1, 340-2, 340-3 and 340-4 is spaced apart from device MTJ 320 by about the same distance d3. In illustrative embodiments, distance d3 is less than or equal to about 200 nm.

While only four sensor MTJs 340 are illustrated in FIGS. 3 and 4, any other number of sensor MTJs 340 may be included. Likewise, while only a single array 302 is illustrated, any number of additional arrays 302 may also be included.

As shown in FIGS. 3 and 4, diagram 300 further illustrates the spin polarization 330 of the free layer of device MTJ 320 and the respective spin polarizations 350-1, 350-2, 350-3 and 350-4 of the free layers of the sensor MTJs 340-1, 340-2, 340-3 and 340-4.

As seen in FIG. 3, the spin polarizations 330 and 350-1, 350-2, 350-3 and 350-4 are initially set to the same state, e.g., parallel or anti-parallel, shown as toward the left side of the page, depending on the spin polarization of the fixed layers. As can be seen in FIG. 3, the magnetic field 360 is oriented in the same direction as the spin polarization 330, e.g., toward the left. When electrical energy is supplied to the device MTJ 320 to change the spin polarization 330 to the other of the parallel or anti-parallel states, for example, toward the right as shown in FIG. 4, the magnetic field 360 also changes direction to match the spin polarization 330. For example, the electrical energy may be supplied with a voltage of 500 mV to change the spin polarization 330.

In response to the change in the direction of the magnetic field 360, the spin polarizations 350-2, 350-3 and 350-4 of the sensor MTJs 340-2, 340-3 and 340-4 are also changed, e.g., toward the right, as shown in FIG. 4. However, as seen in FIG. 4, the spin polarization 350-1 of sensor MTJ 340-1 is not changed by the magnetic field 360 and is still in the initial state, e.g., toward the left. This is because the magnetic field 360 was not strong enough at distance $d_3$ to force a change in the spin polarization 350-1 of the sensor MTJ 340-1 but was strong enough to force a change in the spin polarizations 350-2, 350-3 and 350-4 of the smaller sensor MTJs 340-2, 340-3 and 340-4. By utilizing sensor MTJs 340 having different sizes or widths that are spaced apart from the device MTJ 320 at the same distance $d_3$, the strength of the magnetic field 360 generated by the spin polarization 330 of the device MTJ 320 may be determined. For example, a critical size or width 380 may be determined based at least in part on which of the sensor MTJs 340 have an opposite spin polarization 350 as compared to the spin polarization 330 of the device MTJ 320. For example, the critical size or width 380 may be determined as the size or width of the smallest sensor MTJ 340 that has an opposite spin polarization 350 to the spin polarization 330 of the device MTJ 320, in this example the size or width of sensor MTJ 340-1. In some embodiments, the critical size or width 380 may be determined as a size or width that is between the smallest sensor MTJ 340 that has an opposite spin polarization 350 to the spin polarization 330 of the device MTJ 320 and the largest sensor MTJ 340 that as the same spin polarization 350 as the spin polarization of the device MTJ 320.

In illustrative embodiments, a monitoring circuit determines the spin polarizations 350 of the free layers of the sensor MTJs 340 by supplying electrical energy to the sensor MTJs 340. The monitoring circuit may function in a similar manner to monitoring circuit 147, described above. The electrical energy supplied to the sensor MTJs 340 has sufficient voltage to sense the magnetoresistance of the sensor MTJs 340, i.e., to determine whether the spin polarizations of the free layers are parallel or anti-parallel to the spin polarizations of the fixed layers, but does not have enough voltage to actually cause the spin polarizations to change state between the parallel and anti-parallel states. For example, electrical energy having a voltage of 50 mV may be supplied to the sensor MTJs 340 to sense the state of the spin polarizations 350. In some embodiments, any voltage value below a predefined threshold value at which the spin polarization 350 of a given sensor MTJ 340 will switch states may be used to sense the spin polarizations 350. In some embodiments, the threshold voltage may vary depending on the size or width of the sensor MTJs 340. In some embodiments, the threshold value for a given sensor MTJ 340 may be predetermined, for example based on one or more characteristics or properties of the given sensor MTJ 340. The monitoring circuit may then determine the critical size or width 380 based on the determined spin polarizations as described above.

The magnetization strength of the free layer 330 of the device MTJ 320 may then be determined based at least in part on the determined critical size or width 380 according to equation (1) below:

$$B(r) = \frac{\mu_0}{4\pi}\left[\frac{3\hat{r}(m \cdot \hat{r}) - m}{r^3}\right] \quad (1)$$

Where B(r) is the magnetic field strength at a critical distance r; $\mu_0$ is a constant; r represents the distance between the magnetized source and the point where the magnetic field is being measured (e.g., distance $d_3$ in the example of FIGS. 3 and 4); and m represents the magnetic dipole moment which is used as a proxy for the magnetization strength of the free layer 330 of the device MTJ 320.

For example, critical size or width 380 is used to determine the magnetization (m) of the corresponding free layer of the sensor MTJ 340. Based on equation (1), given the magnetization (m) and the distance (r) from the sensor MTJ 340 to the device MTJ 320, e.g., $d_3$, the associated magnetic field strength (B) generated by the free layer of the device MTJ 320 can be calculated. Once B is known for the free layer of the device MTJ 320, the corresponding magnetization (m) can also be calculated using equation (1).

Figure 5:
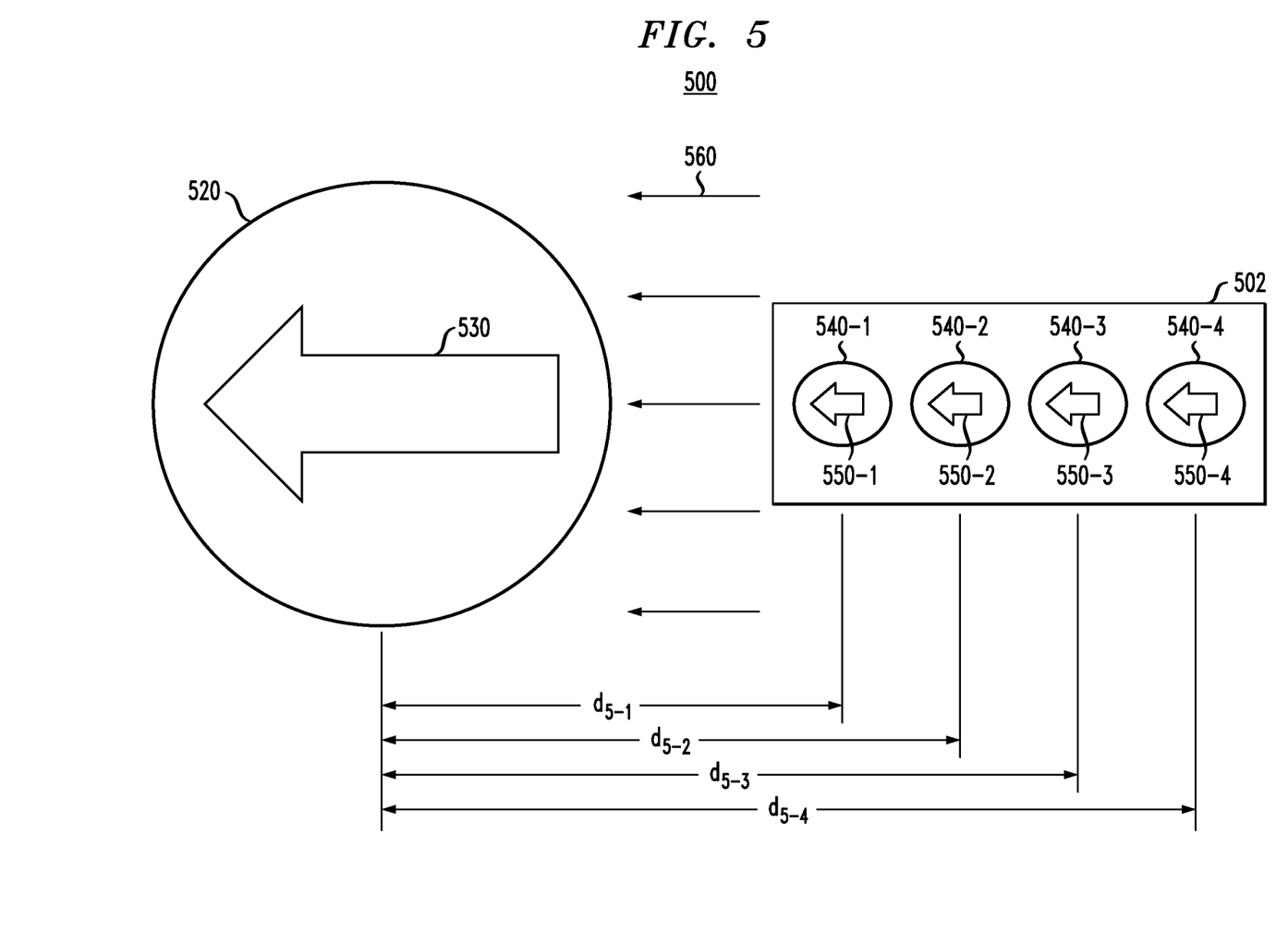
FIG. 5 is a diagram of another example arrangement of device and sensor MTJs according to an embodiment of the present disclosure.
Figure 6:
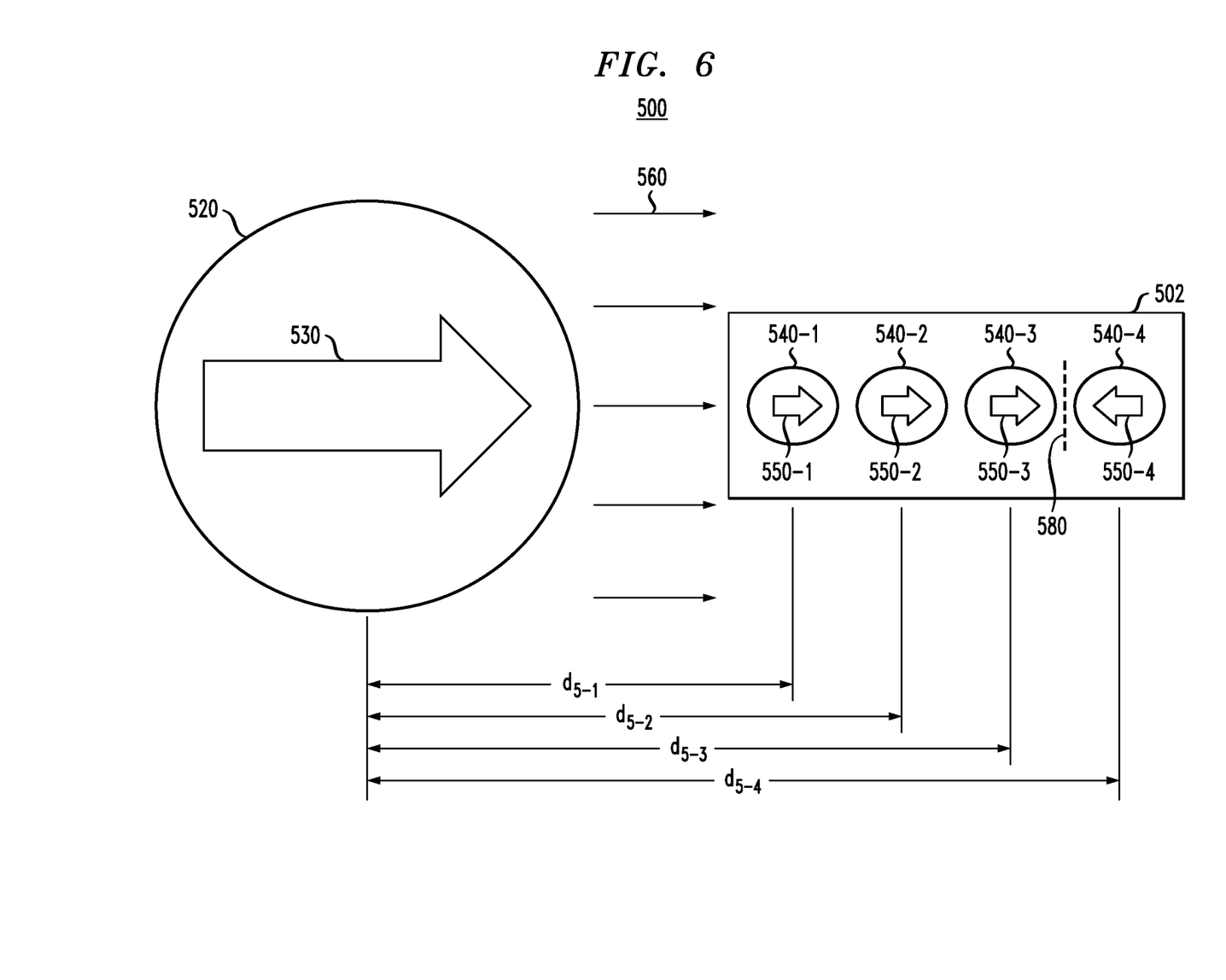
FIG. 6 is a diagram of the example arrangement of FIG. 5 after a change in the spin polarization of the free layer of the device MTJ according to an embodiment of the present disclosure.

With reference now to FIGS. 5 and 6, an example diagram 500 of a device MTJ 520 and an array 502 of sensor MTJs 540 is illustrated from a top down perspective according to an illustrative embodiment. Device MTJ 520 is similar to and includes the same features as described above for device MTJ 120. Sensor MTJs 540 are each similar to and include the same features as described above for sensor MTJ 140.

As seen in FIGS. 5 and 6, the array 502 comprises sensor MTJs 540-1, 540-2, 540-3 and 540-4 each having about the same size or width. In illustrative embodiments, each sensor MTJ 540 in the array 502 also has a smaller size or width than the device MTJ 520. In some embodiments, the sensor MTJs 540 may have the same size or width as the device MTJ 520.

In illustrative embodiments, each of sensor MTJs 540-1, 540-2, 540-3 and 540-4 are spaced apart from device MTJ 520 by different distances, $d_{5-1}$, $d_{5-2}$, $d_{5-3}$ and $d_{5-4}$. In some embodiments, each distance $d_{5-1}$, $d_{5-2}$, $d_{5-3}$ and $d_{5-4}$ is less than or equal to about 200 nm. As shown in FIGS. 5 and 6, in an illustrative embodiment, $d_{5-1} < d_{5-2} < d_{5-3} < d_{5-4}$.

While only four sensor MTJs 540 are illustrated in FIGS. 5 and 6, any other number of sensor MTJs 540 may be included, each having a different distance from device MTJ 520. Likewise, while only a single array 502 is illustrated, any number of additional arrays 502 may also be included.

As shown in FIGS. 5 and 6, diagram 500 further illustrates the spin polarization 530 of the free layer of device MTJ 520 and the respective spin polarizations 550-1, 550-2, 550-3 and 550-4 of the free layers of the sensor MTJs 540-1, 540-2, 540-3 and 540-4.

As seen in FIG. 5, the spin polarizations 530 and 550-1, 550-2, 550-3 and 550-4 are initially set to the same state, e.g., parallel or anti-parallel, shown as toward the left side of the page, depending on the spin polarization of the fixed layers. As can be seen in FIG. 5, the magnetic field 560 is oriented in the same direction as the spin polarization 530, e.g., toward the left. When electrical energy is supplied to the device MTJ 520 to change the spin polarization 530 to the other of the parallel or anti-parallel states, for example, toward the right as shown in FIG. 6, the magnetic field 50 also changes direction to match the spin polarization 530. For example, electrical energy may be supplied with a voltage of 500 mV to change the spin polarization 530.

In response to the change in the direction of the magnetic field 560, the spin polarizations 550-1, 550-2 and 550-3 of the sensor MTJs 540-1, 540-2 and 540-3 are also changed, e.g., toward the right, as shown in FIG. 6. However, as seen in FIG. 6, the spin polarization 550-4 of sensor MTJ 540-4 is not changed by the magnetic field 560 and is still in the initial state, e.g., toward the left. This is because the magnetic field 560 was not strong enough at distance d5-4 to force a change in the spin polarization 550-4 of the sensor MTJ 540-4 but was strong enough to force a change in the spin polarizations 550-1, 550-2 and 550-3 of the closer sensor MTJs 540-1, 540-2 and 540-3. By utilizing sensor MTJs 540 having about the same size but spaced apart from the device MTJ 520 by different distances d5-1, d5-2, d5-3 and d5-4, the strength of the magnetic field 560 generated by the spin polarization 530 of the device MTJ 520 may be determined. For example, a critical distance 580 may be determined based at least in part on which of the sensor MTJs 540 have an opposite spin polarization 550 as compared to the spin polarization 530 of the device MTJ 520. For example, the critical distance 580 may be determined as the distance of the closest sensor MTJ 540 that has an opposite spin polarization 550 to the spin polarization 530 of the device MTJ 520, in this example the distance d5-4 of sensor MTJ 540-4. In some embodiments, the critical distance 580 may be determined as a distance that is between the closest sensor MTJ 540 that has an opposite spin polarization 550 to the spin polarization 530 of the device MTJ 520 and the farthest sensor MTJ 540 that as the same spin polarization 550 as the spin polarization of the device MTJ 520.

In illustrative embodiments, a monitoring circuit determines the spin polarizations 550 of the free layers of the sensor MTJs 540 by supplying electrical energy to the sensor MTJs 540. The monitoring circuit may function in a similar manner to monitoring circuit 147, described above. The electrical energy supplied to the sensor MTJs 540 has sufficient voltage to sense the magnetoresistance of the sensor MTJs 540, i.e., determine whether the spin polarizations of the free layers are parallel or anti-parallel to the spin polarization of the fixed layers but does not have enough voltage to actually cause the spin polarizations to change state between the parallel and anti-parallel states. For example, electrical energy having a voltage of 50 mV may be supplied to the sensor MTJs 540 to sense the state of the spin polarizations 550. In some embodiments, any voltage value below a predefined threshold value at which the spin polarization 550 of a given sensor MTJ 540 will switch states may be used to sense the spin polarizations 550. In some embodiments, the threshold voltage may vary depending on the size or width of the sensor MTJs 540. In some embodiments, the threshold value for a given sensor MTJ 540 may be predetermined, for example based on one or more characteristics or properties of the given sensor MTJ 540. The monitoring circuit may then determine the critical distance 580 based on the determined spin polarizations as described above.

The magnetization strength of the free layer 530 of the device MTJ 520 may then be determined based at least in part on the determined critical distance 580 according to equation (1) above.

For example, according to equation (1) the strength of the magnetic field 560 (B) generated by the free layer of the device MTJ 520 decays with increasing distance (r) from the device MTJ 520. Given a series of sensor MTJs 540 of a given size or width that are spaced apart from the device MTJ 520 at varying distances, e.g., $d_{5-1}$, $d_{5-2}$, $d_{5-3}$ and $d_{5-4}$, a maximum distance (r) at which the strength of the magnetic field (B) is strong enough to flip the spin polarization 550 of the sensor MTJs 540 of the given size or width may be determined. Once this maximum distance (r) is known, the size or width of the corresponding sensor MTJ 520 may be used to determine the magnetization (m) of the sensor MTJ 520 at that distance. A magnetic field strength (B) of the device MTJ 520 can then be calculated according to equation (1) based on the maximum distance (r) and the magnetization (m) of the sensor MTJ 520. Based on the strength of the magnetic field (B) generated by the device MTJ 520, the corresponding magnetization (m) of the free layer of the device MTJ 520 can also be calculated using equation (1).

Figure 7:
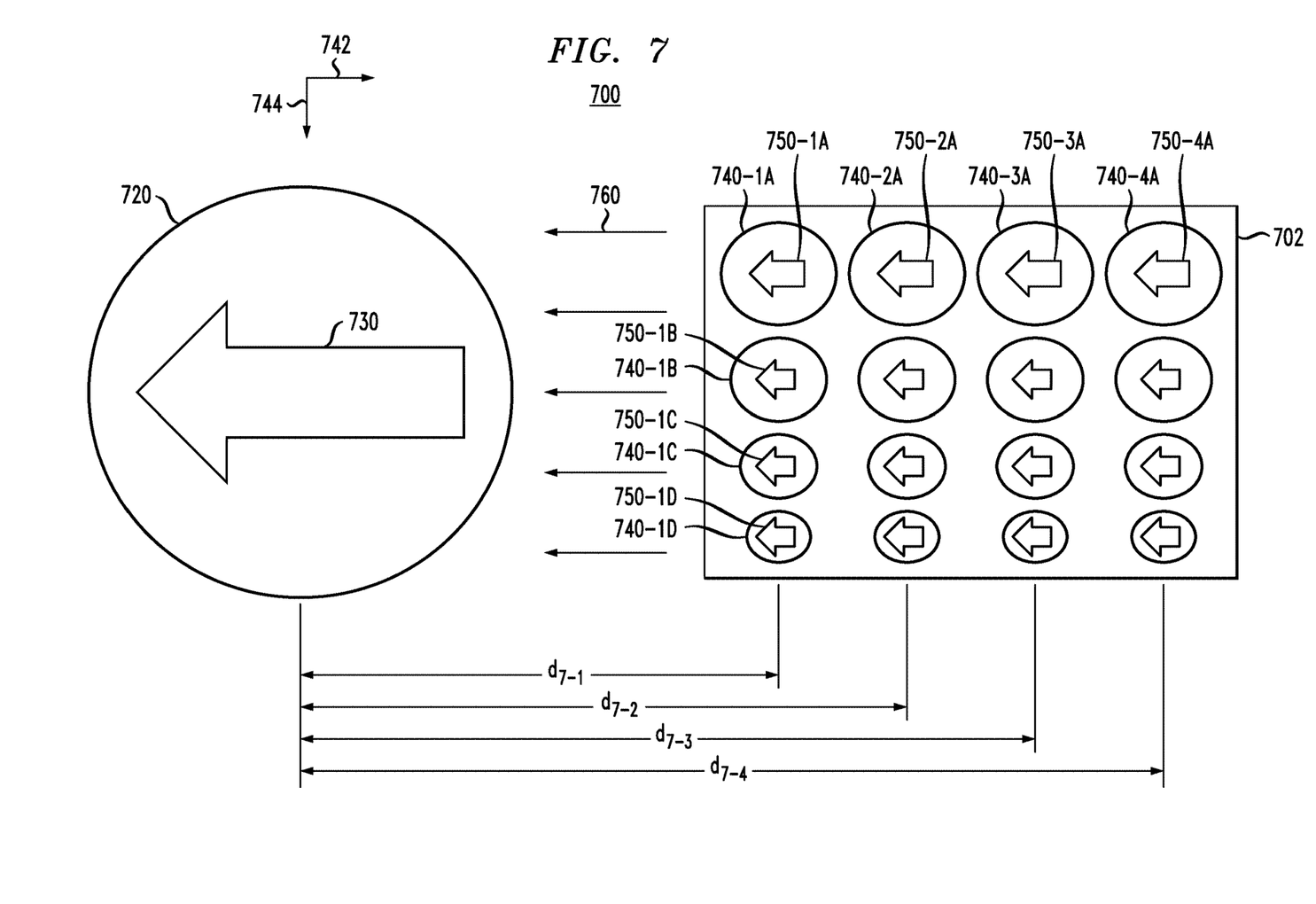
FIG. 7 is a diagram of another example arrangement of device and sensor MTJs according to an embodiment of the present disclosure.
Figure 8:
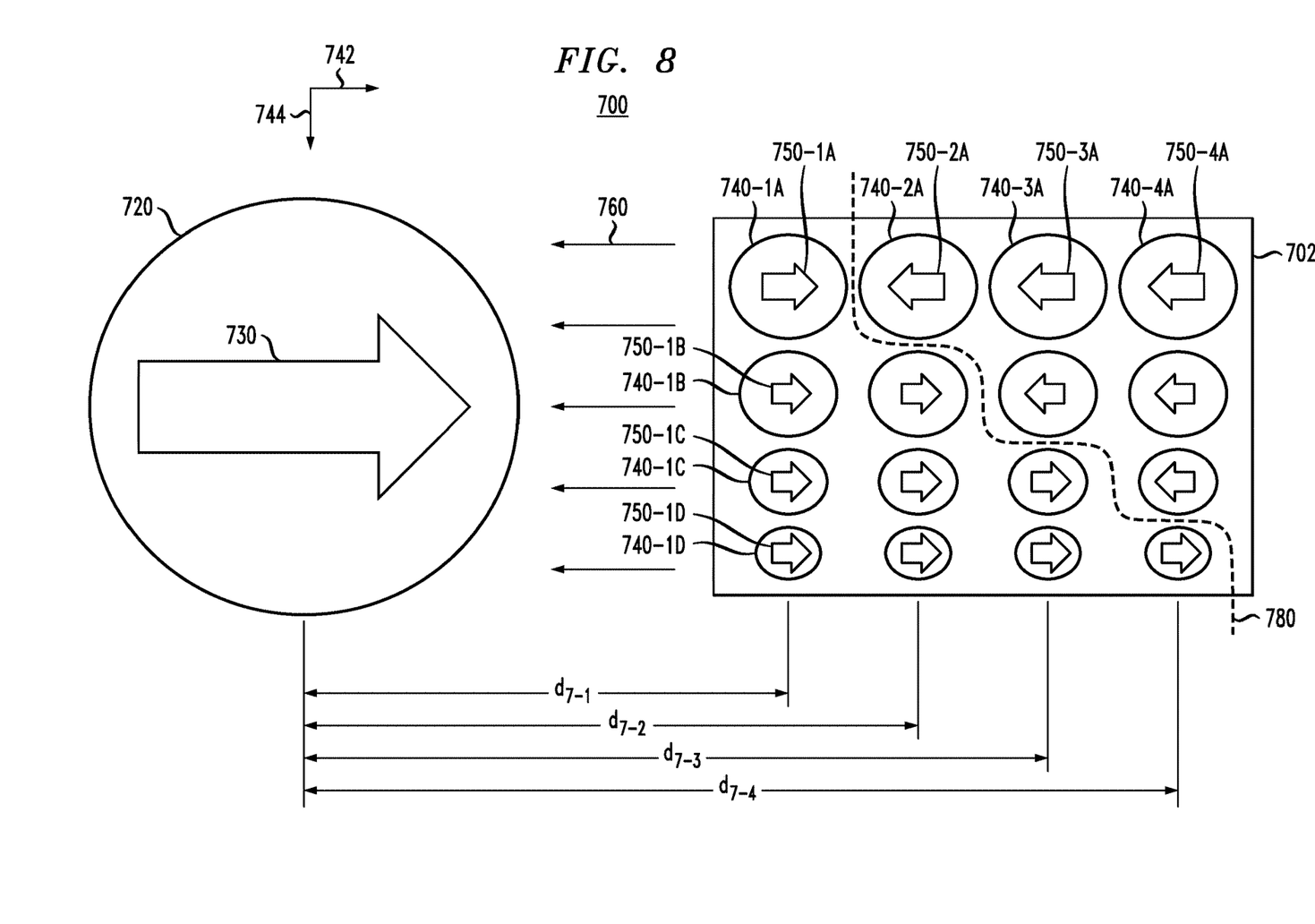
FIG. 8 is a diagram of the example arrangement of FIG. 7 after a change in the spin polarization of the free layer of the device MTJ according to an embodiment of the present disclosure.

With reference now to FIGS. 7 and 8, an example diagram 700 of a device MTJ 720 and an array 702 of sensor MTJs 740 is illustrated from a top down perspective according to an illustrative embodiment. Device MTJ 720 is similar to and includes the same features as described above for device MTJ 120. Sensor MTJs 740 are each similar to and include the same features as described above for sensor MTJ 140.

As seen in FIGS. 7 and 8, the array 702 comprises a pattern of sensor MTJs 740 that are arranged according to both size or width and distance. For example, in the illustrated embodiment, the sensor MTJs 740 of the array 702 having the same size or width are spaced apart from the device MTJ 720 in a first direction 742 by different distances. For example, sensor MTJs 740-1A, 740-2A, 740-3A and 740-4A are spaced apart from device MTJ 720 by distances $d_{7-1}$, $d_{7-2}$, $d_{7-3}$ and $d_{7-4}$, respectively. In addition, the sensor MTJs 740 of the array 702 are arranged in a second direction 744 according to their respective sizes and widths and spaced apart from the device MTJ 720 by the same distance. For example, sensor MTJ 740-1A has a greater size or width than sensor MTJ 740-1B, sensor MTJ 740-1B has a greater size or width than sensor MTJ 740-1C and 740-1C has a greater size or width than sensor MTJ 740-1D. In this example, sensor MTJs 740-1A, 740-1B, 740-1C, and 740-1D are each spaced apart from device MTJ 720 by about the same distance, e.g., $d_{7-1}$. While not labeled for clarity, each of sensor MTJs 740-2A, 740-3A, and 740-4A also has corresponding B, C, and D sensor MTJs that have successively smaller sizes or widths in the second direction 744 which correspond to the sizes or widths of their respective sensor MTJs 740-1B, 740-1C and 740-1D in the first direction 742.

In some embodiments, each distance $d_{7-1}$, $d_{7-2}$, $d_{7-3}$ and $d_{7-4}$ is less than or equal to about 200 nm. As shown in FIGS. 7 and 8, in an illustrative embodiment, $d_{7-1} < d_{7-2} < d_{7-3} < d_{7-4}$.

While only four sensor MTJs 740 are illustrated in each direction 742 and 744 in FIGS. 7 and 8, any other number of sensor MTJs 740 may be included in each direction. Likewise, while only a single array 702 is illustrated, any number of additional arrays 702 may also be included. Likewise, while only four sizes or widths are illustrated in FIGS. 7 and 8 for FIG. 2, any other number of sizes or widths may be included. In illustrative embodiments, the size or width of device MTJ 720 is greater than or equal to the sizes or widths of the sensor MTJs 740.

As shown in FIGS. 7 and 8, diagram 700 further illustrates the spin polarization 730 of the free layer of device MTJ 720 and the respective spin polarizations 750 of the free layers of the sensor MTJs 740 in the array 702. For example, sensor MTJs 740-1A, 740-1B, 740-1C, 740-1D, 740-2A, 740-3A and 740-4A have respective free layer spin polarizations 750-1A, 750-1B, 750-1C, 750-1D, 750-2A, 750-3A, 750-4A. FIGS. 7 and 8 also illustrate the respective spin polarizations of the other sensor MTJs in the array 702, which are not labeled for the sake of clarity in the diagrams.

As seen in FIG. 7, the spin polarizations 730 and 750 are initially set to the same state, e.g., parallel or anti-parallel, shown as toward the left side of the page, depending on the spin polarization of the fixed layers. As can be seen in FIG. 7, the magnetic field 760 is oriented in the same direction as the spin polarization 730, e.g., toward the left. When electrical energy is supplied to the device MTJ 720 to change the spin polarization 730 to the other of the parallel or anti-parallel states, for example, toward the right as shown in FIG. 8, the magnetic field 760 also changes direction to match the spin polarization 730. For example, the electrical energy may be supplied with a voltage of 500 mV to change the spin polarization 730.

In response to the change in the direction of the magnetic field 760, the spin polarizations 750 of some of the MTJs 740 will also be changed, e.g., toward the right, as shown in FIG. 8. However, as seen in FIG. 8, not all of the spin polarizations 750 will be changed. In this embodiment, the magnetic field strength of the spin polarization 730 of the device MTJ 720 may be determined in more detail as compared to the embodiments in diagrams 300 and 500 since both different sizes or widths of the sensor MTJs 740 and different distances of the sensor MTJs 740 are used.

With continued reference to FIG. 8, for example, the spin polarizations 750 of the sensor MTJs 740-1A, 740-1B, 740-1C and 740-1D are changed to match the spin polarization 730 of the device MTJ 720 while the spin polarizations 750-2A, 750-3A and 750-4A of the sensor MTJs 740-2A, 740-3A and 740-4A are not changed by the magnetic field 760 and are still in the initial state, e.g., toward the left. As before, this is because the magnetic field 760 was strong enough at distance $d_{7-1}$ to change the spin polarization 750-1A of sensor MTJ 740-1A but not strong enough at distances $d_{7-2}$, $d_{7-3}$ and $d_{7-4}$ to force a change in the spin polarizations 750-2A, 750-3A and 750-4A of the sensor MTJs 740-2A, 740-3A and 740-4A which have the same size or width as sensor MTJ 740-1 A. A critical distance for the sensor MTJs 740 of a given size may then be determined as described above for the critical distance 580 and used to determine the strength of the magnetic field 760. For example, as seen in FIG. 8, as the size or width of the sensor MTJs 740 decrease in the second direction 744, the critical distance at which the magnetic field is not strong enough to force a change in the spin polarizations 750 increases.

However, as seen in FIG. 8, the strength of the magnetic field 760 may also be determined based at least in part on the critical size or width at which the sensor MTJs 740 of a given distance, having different sizes, change their spin polarizations 750 to match the spin polarization 730 of the device MTJ 720 in a similar manner to that describe above for the critical size or width 380. For example, as the size or width of the sensor MTJs 740 decrease in the second direction 744 at a given distance, the critical size or width also decreases.

As seen in FIG. 8, a critical dimension 780 defines the combination of the critical distance and critical size or width at which the strength of the magnetic field 760 is no longer sufficient to change the spin polarizations 150 of the sensor MTJs 740. As can be seen in FIG. 8, for example, as the distance from the device MTJ 720 increases, the strength of the magnetic field 760 decreases, thereby reducing the size of the sensor MTJ 740 that the magnetic field 760 can change.

By utilizing an array 702 that has sensor MTJs 740 of the same size or width at a plurality of different distances and also sensor MTJs 740 of different sizes or widths at the each of the distances the strength of the magnetic field 760 generated by the spin polarization 730 of the device MTJ 720 may be determined in greater detail as compared to that of arrays 302 and 502. For example, the critical dimension 780 may be determined based at least in part on which of the sensor MTJs 740 have an opposite spin polarization 750 as compared to the spin polarization 730 of the device MTJ 720. For example, the critical dimension 780 may be determined based on the size or width of the smallest sensor MTJ 740 that has an opposite spin polarization 750 to the spin polarization 730 of the device MTJ 720 at each distance and also based on the distance of the closest sensor MTJ 740 of each size or width that has an opposite spin polarization 750 to the spin polarization 730 of the device MTJ 720. In some embodiments, the critical dimension 780 may be determined based on the size or width that is between the smallest sensor MTJ 740 that has an opposite spin polarization 750 to the spin polarization 730 of the device MTJ 720 at each distance and the largest sensor MTJ 740 that has the same spin polarization 750 as the spin polarization of the device MTJ 720 at each distance and based on the distance that is between the closest sensor MTJ 740 that has an opposite spin polarization 750 to the spin polarization 730 of the device MTJ 720 at each size or width and the farthest sensor MTJ 740 that has the same spin polarization 750 as the spin polarization of the device MTJ 720 at each size or width.

In illustrative embodiments, a monitoring circuit determines the spin polarizations 750 of the free layers of the sensor MTJs 740 by supplying electrical energy to the sensor MTJs 740. The monitoring circuit may function in a similar manner to monitoring circuit 147, described above. The electrical energy supplied to the sensor MTJs 740 has sufficient voltage to sense the magnetoresistance of the sensor MTJs 740, i.e., determine whether the spin polarizations of the free layers are parallel or anti-parallel to the spin polarization of the fixed layers but does not have enough voltage to actually cause the spin polarizations to change state between the parallel and anti-parallel states. For example, electrical energy having a voltage of 50 mV may be supplied to the sensor MTJs 740 to sense the state of the spin polarizations 750. In some embodiments, any voltage value below a predefined threshold value at which the spin polarization 750 of a given sensor MTJ 740 will switch states may be used to sense the spin polarizations 750. In some embodiments, the threshold voltage may vary depending on the size or width of the sensor MTJs 740. In some embodiments, the threshold value for a given sensor MTJ 740 may be predetermined, for example based on one or more characteristics or properties of the given sensor MTJ 740. The monitoring circuit may then determine the critical dimension 780 based on the determined spin polarizations as described above.

The magnetization (m) of the free layer 730 of the device MTJ 720 may then be determined based at least in part on the critical dimension 780 according to equation (1) above in a similar manner to that described above for the free layer 330 of the device MTJ 320 and free layer 530 of the device MTJ 520. In this embodiment, additional data points may be used to improve accuracy of the magnetization calculation due to the combination of the critical width or size and critical distance in the form of the critical dimension for the array 702 of sensor MTJs 740.

In illustrative embodiments, the spin polarizations 150 of the free layers 142 of the sensor MTJs 140 may be reset to a target state by the monitoring circuit 147, e.g., parallel or anti-parallel, by supplying electrical energy to the sensor MTJs 140 via lead 148 at a voltage above their respective threshold voltages. In some embodiments, for example, the monitoring circuit 147 may reset the spin polarizations 150 of the free layers 142 of the sensor MTJs 140 to the target state by supplying electrical energy to the sensor MTJs 140 via lead 148 at a voltage of about 500 mV. Any other voltage level may be used so long as it is sufficient to cause a change in the state of the spin polarizations 150 of the free layers 142 of the sensor MTJs 140 to the target state. In illustrative embodiments, the electrical energy is supplied in a first direction along lead 148 to change the state of the spin polarizations 150 of the free layers 142 of the sensor MTJs 140 to the parallel state and in a second direction along lead 148 to change the state of the spin polarizations 150 of the free layers 142 of the sensor MTJs 140 to the anti-parallel state.

In some embodiments, for example, the spin polarizations 150 of the free layers 142 of the sensor MTJs 140 may be reset to match the spin polarization 130 of the free layer 122 of the device MTJ 120 to ensure that when the spin polarization 130 of the free layer 122 of the device MTJ 120 changes states, only those spin polarizations 150 of the free layers 142 of the sensor MTJs 140 that are susceptible to the magnetic field 160 will also have the same spin polarization 150 while those that are not susceptible, e.g., greater than the critical size or width 380, farther than the critical distance 580, or beyond the critical dimension 780, will remain in the initial state and have spin polarizations 150 that are opposite to the changed spin polarization 130.

Resetting the spin polarizations 150 of the free layers 142 of the sensor MTJs 140 to a known target state provides increased accuracy in monitoring of changes in the spin polarizations 150 of the free layers 142 of the sensor MTJs 140 in response to changes in the spin polarization 130 of the free layer 122 of the device MTJ 120 by providing a known initial state for the spin polarizations 150 of the free layers 142 of the sensor MTJs 140.

Figure 9:
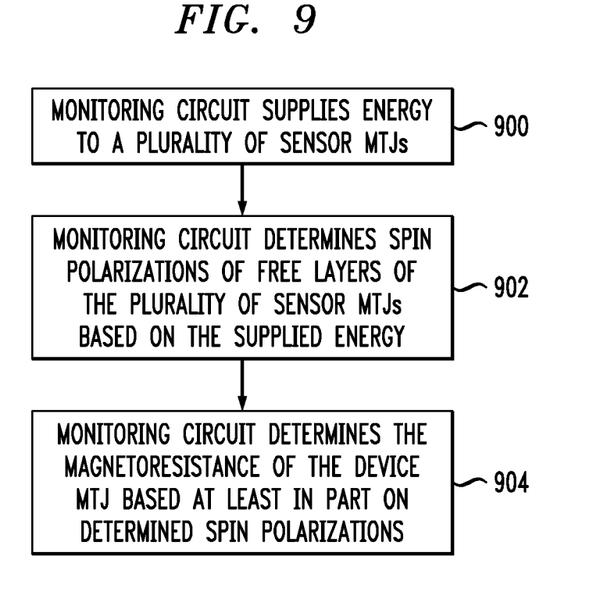
FIG. 9 is a flow chart of an example technique for determining the magnetoresistance of a device MTJ using magnetic coupling to a sensor MTJ according to an embodiment of the present disclosure.

Referring now to FIG. 9, a method for determining the magnetization strength of the free layer 130 of the device MTJ 120 is disclosed. While described with reference to device MTJ 120 and sensor MTJ 140, the method also or alternatively be performed using device MTJs 320, 520 and 720 and arrays 302, 502 and 702 of sensor MTJs 340, 540 and 740.

At 900, the monitoring circuit 147 supplies energy to a plurality of sensor MTJs 140, for example, at a voltage below the threshold voltage at which the spin polarization 150 of the free layers 142 of the sensor MTJs 140 would be changed.

At 902, the monitoring circuit 147 determines the corresponding free layer spin polarizations 150 of the sensor MTJs 140 based at least in part on the supplied energy. For example, based on the resistance of each sensor MTJ 140, the monitoring circuit 147 can determine whether the spin polarization 150 of the free layer 142 is parallel or anti-parallel to the spin polarization 152 of the fixed layer 146. The monitoring circuit 147 then determines the critical size or width 380, critical distance 580 or critical dimension 780 based on which sensor MTJs 140 have spin polarizations 150 that are opposite to the spin polarizations 130 of the device MTJ 120, for example, as described above.

At 904, the monitoring circuit 147 determines the magnetoresistance of the device MTJ 120 based at least in part on the determined corresponding free layer spin polarizations 150 of the sensor MTJs 140 and the determined critical size or width 380, critical distance 580 or critical dimension 780, for example, using equation (1) as described above.

Figure 10:
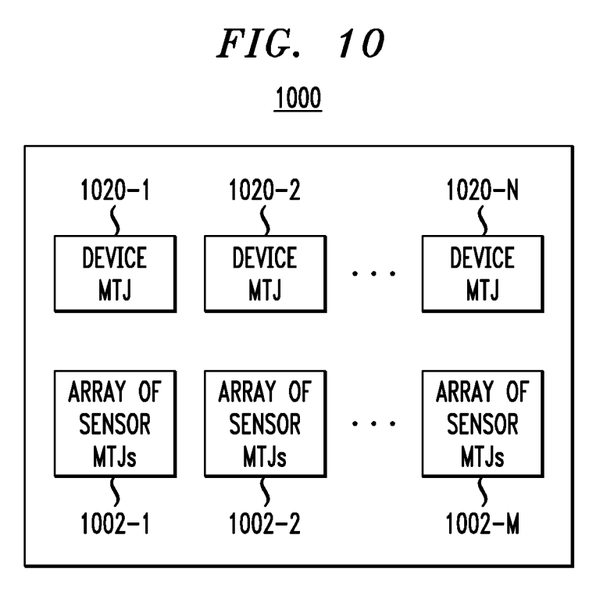
FIG. 10 illustrates an example semiconductor device 1100 comprising an array of device MTJs and corresponding arrays of sensor MTJs according to an embodiment of the present disclosure.

FIG. 10 illustrates an example semiconductor device 1100 comprising an array of device MTJs 1020-1, 1020-2 . . . 1020-N, collectively referred to as device MTJs 1020, and corresponding arrays 1002-1, 1002-2 . . . 1002-M of sensor MTJs, collectively referred to as arrays 1002. The device MTJs 1020 comprise similar components as device MTJ 120 and together may form a memory device for storing data. For example, eight device MTJs 1020 may comprise storage for a byte of data where, for example, each device MTJ 1020 may store the value of a single bit, i.e., a one or a zero, depending on the spin polarization of the free layer, i.e., parallel or anti-parallel, relative to the spin polarization of the fixed layer. As seen in FIG. 10, each device MTJ 1020 has a corresponding array 1002 of sensor MTJs. Arrays 1002 comprise sensor MTJs comprising similar components as sensor MTJ 140. The sensor MTJs of array 1002 may be formed in a pattern similar to one of arrays 302, 502 and 702 or any other pattern and may implement similar functionality as that described above with reference to arrays 302, 502 and 702. In some embodiments, each device MTJ 1020 may have more than one corresponding array 1002, for example, for redundancy.

It is to be understood that the devices and methods discussed herein for determining the magnetoresistance of a device MTJ based on magnetic coupling to a sensor MTJ can be incorporated within semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A semiconductor device comprising:
a device magnetic tunnel junction comprising a free layer, a fixed layer and at least one insulating layer disposed between the free layer and the fixed layer, a spin polarization of the free layer being configurable based at least in part on electrical energy supplied to the device magnetic tunnel junction by the semiconductor device;
a plurality of sensor magnetic tunnel junctions spaced apart from the device magnetic tunnel junction, each sensor magnetic tunnel junction comprising a corresponding free layer, a corresponding fixed layer and at least one corresponding insulating layer disposed between the corresponding free layer and the corresponding fixed layer, a spin polarization of the corresponding free layer of each sensor magnetic tunnel junction being configurable based at least in part on a magnetic field created by the spin polarization of the free layer of the device magnetic tunnel junction; and
a circuit of the semiconductor device disposed in electrical communication with the plurality of sensor magnetic tunnel junctions and configured to determine the corresponding free layer spin polarizations of each of the sensor magnetic tunnel junctions based at least in part on electrical energy supplied to the sensor magnetic tunnel junctions by the circuit, the circuit configured to determine a magnetoresistance of the device magnetic tunnel junction based at least in part on which of the sensor magnetic tunnel junctions are determined to have a corresponding free layer spin polarization that is opposite to the free layer spin polarization of the device magnetic tunnel junction.

2. The semiconductor device of claim 1, wherein the plurality of sensor magnetic tunnel junctions are electrically isolated from the device magnetic tunnel junction.

3. The semiconductor device of claim 1,
wherein the sensor magnetic tunnel junctions each have the same size; and
wherein the circuit is configured to determine the magnetoresistance of the device magnetic tunnel junction based at least in part on a determination that the corresponding free layer spin polarization of a given sensor magnetic tunnel junction is opposite to the free layer spin polarization of the device magnetic tunnel junction, the given sensor magnetic tunnel junction having the smallest distance from the device magnetic tunnel junction among the sensor magnetic tunnel junctions determined to have corresponding free layer spin polarizations that are opposite to the free layer spin polarization of the device magnetic tunnel junction.

4. The semiconductor device of claim 1,
wherein the sensor magnetic tunnel junctions each have a different size; and
wherein the circuit is configured to determine the magnetoresistance of the device magnetic tunnel junction based at least in part on a determination that the corresponding free layer spin polarization of a given sensor magnetic tunnel junction is opposite to the free layer spin polarization of the device magnetic tunnel junction, the given sensor magnetic tunnel junction having the smallest size among the sensor magnetic tunnel junctions determined to have corresponding free layer spin polarizations that are opposite to the free layer spin polarization of the device magnetic tunnel junction.

5. The semiconductor device of claim 1, wherein the circuit is configured to supply electrical energy to a given sensor magnetic tunnel junction at a first voltage to determine the free layer spin polarization of the given sensor magnetic tunnel junction.

6. The semiconductor device of claim 5, wherein the first voltage is smaller than a threshold voltage, the threshold voltage being the voltage required to change the free layer spin polarization of the given sensor magnetic tunnel junction to a target spin polarization.

7. The semiconductor device of claim 6, wherein the circuit is configured to supply electrical energy to the given sensor magnetic tunnel junction at a second voltage to reset the free layer spin polarization of the given sensor magnetic tunnel junction to a target spin polarization, the second voltage being greater than or equal to the threshold voltage.

8. A method comprising:
supplying energy to a plurality of sensor magnetic tunnel junctions, each sensor magnetic tunnel junction comprising a corresponding free layer, a corresponding fixed layer and at least one corresponding insulating layer disposed between the corresponding free layer and the corresponding fixed layer, a spin polarization of the corresponding free layer of each sensor magnetic tunnel junction being configurable based at least in part on a magnetic field created by a spin polarization of a free layer of a device magnetic tunnel junction that is spaced apart from the plurality of sensor magnetic tunnel junctions;
determining the corresponding free layer spin polarizations of the sensor magnetic tunnel junctions based at least in part on the supplied energy;
determining which of the sensor magnetic tunnel junctions have a corresponding free layer spin polarization that is opposite to the free layer spin polarization of the device magnetic tunnel junction; and
determining a magnetoresistance of the device magnetic tunnel junction based at least in part on which of the sensor magnetic tunnel junctions are determined to have a corresponding free layer spin polarization that is opposite to the free layer spin polarization of the device magnetic tunnel junction.

9. The method of claim 8, wherein the plurality of sensor magnetic tunnel junctions are electrically isolated from the device magnetic tunnel junction.

10. The method of claim 8,
wherein the sensor magnetic tunnel junctions each have the same size; and
wherein the magnetoresistance of the device magnetic tunnel junction is determined based at least in part on a determination that the corresponding free layer spin polarization of a given sensor magnetic tunnel junction is opposite to the free layer spin polarization of the device magnetic tunnel junction, the given sensor magnetic tunnel junction having the smallest distance from the device magnetic tunnel junction among the sensor magnetic tunnel junctions determined to have corresponding free layer spin polarizations that are opposite to the free layer spin polarization of the device magnetic tunnel junction.

11. The method of claim 8,
wherein the sensor magnetic tunnel junctions each have a different size; and
wherein the magnetoresistance of the device magnetic tunnel junction is determined based at least in part on a determination that the corresponding free layer spin polarization of a given sensor magnetic tunnel junction is opposite to the free layer spin polarization of the device magnetic tunnel junction, the given sensor magnetic tunnel junction having the smallest size among the sensor magnetic tunnel junctions determined to have corresponding free layer spin polarizations that are opposite to the free layer spin polarization of the device magnetic tunnel junction.

12. The method of claim 8, wherein supplying energy to the plurality of sensor magnetic tunnel junctions comprises supplying electrical energy to a given sensor magnetic tunnel junction at a first voltage to determine the free layer spin polarization of the given sensor magnetic tunnel junction, the first voltage being smaller than a threshold voltage, the threshold voltage being the voltage required to change the free layer spin polarization of the given sensor magnetic tunnel junction to a target spin polarization.

13. The method of claim 12, further comprising supplying electrical energy to the given sensor magnetic tunnel junction at a second voltage to reset the free layer spin polarization of the given sensor magnetic tunnel junction to a target spin polarization, the second voltage being greater than or equal to the threshold voltage.

14. A semiconductor device comprising:
a device magnetic tunnel junction comprising a free layer, a fixed layer and at least one insulating layer disposed between the free layer and the fixed layer, a spin polarization of the free layer being configurable based at least in part on electrical energy supplied to the device magnetic tunnel junction by the semiconductor device;
a plurality of sensor magnetic tunnel junctions arranged in an array comprising a first direction and a second direction, the sizes of the sensor magnetic tunnel junctions arranged in the first direction being the same, the sizes of the sensor magnetic tunnel junctions arranged in the second direction being different, the sensor magnetic tunnel junctions arranged in the first direction being spaced apart from the device magnetic tunnel junction by different distances and the sensor magnetic tunnel junctions arranged in the second direction being spaced apart from the device magnetic tunnel junction by about the same distance, each sensor magnetic tunnel junction comprising a corresponding free layer, a corresponding fixed layer and at least one corresponding insulating layer disposed between the corresponding free layer and the corresponding fixed layer, a spin polarization of the corresponding free layer of each sensor magnetic tunnel junction being configurable based at least in part on a magnetic field created by the spin polarization of the free layer of the device magnetic tunnel junction; and a circuit of the semiconductor device disposed in electrical communication with the plurality of sensor magnetic tunnel junctions and configured to determine the corresponding free layer spin polarizations of each of the sensor magnetic tunnel junctions based at least in part on electrical energy supplied to the sensor magnetic tunnel junctions by the circuit, the circuit configured to determine a magnetoresistance of the device magnetic tunnel junction based at least in part on the determined corresponding free layer spin polarizations of the sensor magnetic tunnel junctions.

15. The semiconductor device of claim 14, wherein the magnetic tunnel junctions arranged in the second direction increase in size in the second direction.

16. The semiconductor device of claim 14, wherein the circuit is configured to determine the magnetoresistance of the device magnetic tunnel junction based at least in part on which of the sensor magnetic tunnel junctions are determined to have a corresponding free layer spin polarization that is opposite to the free layer spin polarization of the device magnetic tunnel junction.

17. The semiconductor device of claim 16, wherein the circuit is configured to determine the magnetoresistance of the device magnetic tunnel junction based at least in part on a determination that the corresponding free layer spin polarization of a given sensor magnetic tunnel junction is opposite to the free layer spin polarization of the device magnetic tunnel junction, the given sensor magnetic tunnel junction having the smallest distance from the device magnetic tunnel junction among the sensor magnetic tunnel junctions of the same size that are determined to have corresponding free layer spin polarizations that are opposite to the free layer spin polarization of the device magnetic tunnel junction.

18. The semiconductor device of claim 17, wherein the circuit is configured to determine the magnetoresistance of the device magnetic tunnel junction based at least in part on the sensor magnetic tunnel junctions of each respective size that have the smallest distance from the device magnetic tunnel junction among the sensor magnetic tunnel junctions of the same respective size that are determined to have corresponding free layer spin polarizations that are opposite to the free layer spin polarization of the device magnetic tunnel junction.

19. The semiconductor device of claim 14, wherein the circuit is configured:
to supply electrical energy to a given sensor magnetic tunnel junction of the plurality of sensor magnetic tunnel junctions at a first voltage to determine the free layer spin polarization of the given sensor magnetic tunnel junction; and
to supply electrical energy to the given sensor magnetic tunnel junction at a second voltage to reset the free layer spin polarization of the given sensor magnetic tunnel junction to a target spin polarization.

20. The semiconductor device of claim 19, wherein:
the first voltage is smaller than a threshold voltage, the threshold voltage being the voltage required to change the free layer spin polarization of the given sensor magnetic tunnel junction to a target spin polarization; and
the second voltage is greater than or equal to the threshold voltage.

* * * * *